United States Patent [19]
Yang

[11] Patent Number: 4,733,323
[45] Date of Patent: Mar. 22, 1988

[54] PHOTOTHERMIC AND TIME SWITCH DEVICES FOR OUTDOOR LOW TENSION POWER SUPPLY SYSTEM

[76] Inventor: Tai-Her Yang, 5-1 Taipin St., Si-Hu Town, Dzan-Hwa, Taiwan

[21] Appl. No.: 737,282

[22] Filed: May 23, 1985

[51] Int. Cl.$^4$ .................... H01H 61/02; H01H 37/34; H02H 5/04
[52] U.S. Cl. .................................. 361/105; 361/175; 361/211; 307/117; 307/39
[58] Field of Search ............... 361/103, 105, 106, 211, 361/173, 174, 175, 176, 177; 307/38, 39, 117

[56] References Cited

U.S. PATENT DOCUMENTS

| | | | |
|---|---|---|---|
| 1,618,816 | 2/1927 | Davies | 361/211 |
| 3,048,833 | 8/1962 | Bernheim | 361/211 |
| 3,081,417 | 3/1963 | Collier | 361/211 |
| 3,496,422 | 2/1970 | Horowitz | 361/211 |
| 3,846,674 | 11/1974 | McNulty | 361/106 |

Primary Examiner—M. H. Paschall
Assistant Examiner—H. L. Williams
Attorney, Agent, or Firm—Leonard Bloom

[57] ABSTRACT

A light responsive control and overload protection circuit for low voltage illumination systems includes means responsive to ambient light for providing an enabling output. Control means respond to the enabling output for switching heating current on when enabled. Heat-producing means is provided. The heating current passes through the heat-producing means whenever the control means is enabled. Heat-responsive circuit breaker means are in circuit between a low voltage power source and the load. The heat-producing means is thermally coupled to the heat-responsive circuit breaker means to transfer heat thereto and effect and maintain an opening thereof whenever sufficient ambient light is present. Heat-responsive means respond to heat from the heat-producing means to prevent the overheating thereof during overloads and load circuit short circuiting.

3 Claims, 7 Drawing Figures

PHOTOTHERMIC AND TIME SWITCH DEVICES FOR OUTDOOR LOW TENSION POWER SUPPLY SYSTEM

BACKGROUND OF THE INVENTION

It is understood that owing to the lack of electrical overload and short circuit protective devices in outdoor low voltage power supply systems, damage to a transformer may result in case of short circuit during operation when the power cord is severed by a lawnmower or run over by a vehicle. To maintain the safety of such power supply systems, generally a thermal over-current circuit breaker composed of a bi-metal plate with contact points at its end is usually added in series at the secondary side of the transformer. When the bi-metal plate is heated, by the current in excess of a rated value in the circuit, the temperature of the plate and the heat stored therein reaches a specific level (the activating point) and the normally closed contact points are opened. After the heat of metal plate is dissipated, lowering the temperature to a normal temperature, the plate returns to its normal, original configuration, making the normally closed contacts close, thus restoring the electric conduction. However, the design of the above-noted prior art thermal current breaker requires additional manpower and material costs. For cost effective purposes, the applicant has developed the circuit design of the present invention, using photothermic controlling switch components.

SUMMARY OF THE INVENTION

The conventional light controlled outdoor low voltage power supply system usually utilizes a relay type switch as an on and off drive to operate and control the circuit.

For the purpose of circuit control and protection, a thermal current breaker should be added in series at the output end of the secondary current transformer of the power supply system so as to prevent damage from a short circuit when the shallowly buried power line is severed by a lawnmower. Nevertheless, the additional current breaker also increases manpower and material costs. The photothermic switching circuit of the present invention is so designed that a photoelectric element controls a switch device which, in turn, actuates a thermal element installed outside of a thermal current breaker.

When illuminated, the thermal element is heated by electric current (the detailed circuitry is described in the section of detailed description of the invention). The bi-metal plate circuit breaker trips off, disconnecting the load circuit, after it stores the heat to delay cut-off for a certain period of time.

Following the interruption of illumination, the bi-metal circuit breaker cools down, delaying for a certain period of time closing of the circuit breaker until the plate has become sufficiently cool to again allow flow of the current to the load.

The bi-metal plate circuit breaker automatically opens in case of a short circuit or overload on the power cord or line. The circuit of the present invention is capable of reducing manpower and material costs, and can avoid the interference from false signal, using the photothermic and time switch components of the circuit.

DETAILED DESCRIPTION OF THE PREFERRED EMBODIMENTS

Figure 1:
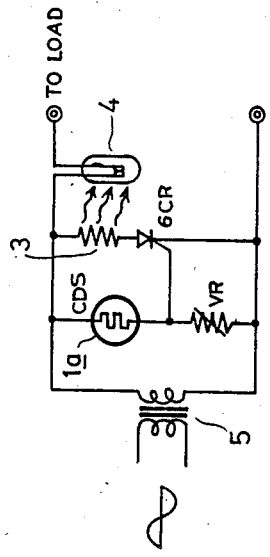
FIG. 1 is a simplified schematic and block diagram of a photothermic control and overload protective circuit for a low voltage illumination system in accordance with the present invention.

As shown in FIG. 1 an exemplary embodiment of the light sensitive control and overload protective circuit for a low voltage illumination system includes a photoelectric element 1 which is made of CDS or other photoelectric material which has a lower electrical resistance when illuminated than when unilluminated. A switching device (controlling element) 2 composed of an SCR, or a TRIAC or a transistor is provided. The SCR may also be an integral part with the photoelectric element 1. A heating resistor 3 connected in series with the switching device is provided. A bi-metal plate thermal breaker 4, which remains closed under normal operating conditions, opens when its heat reaches a given level. The circuit breaker 4 is characterized by the action of automatic heating in case of electrical overload. A transformer 5 having its secondary connected across the heating resistor 3 and the switching device 2 is provided. The secondary is connected in series with the circuit breaker 4.

Under the daylight during daytime, the photoelectric element 1 actuates the switching device 2, which allows current to flow in the heating resistor 3 warming up the heating resistor 3, and heat there from is stored in the thermal bi-metal circuit breaker 4 located next to the heating resistor 3. After the stored heat reaches a specific level, the contact points on the circuit breaker 4 are disconnected; thus, cutting off the load current to electrical illuminating load.

When there is little or no light after dusk, the photoelectric element 1 turns off the switching devices 2, which deactivates the heating resistor 3, and gradually cools off the thermal circuit breaker 4. After the temperature is reduced to specific point, the contact points on the circuit breaker 4 are closed again to enable the transformer 5 to resume power output to the load. In case of a short circuit or overload on the transmission line to the load, the thermal circuit breaker 4 become heated and disconnects its contact points, which will have closed after the temperature is reduced to specific point. The circuit breaker 4 will repeatedly turn off and on the load current until the malfunction of transmission line to the load is corrected.

The capacity of photoelectric element 1 should be large enough to actuate switching element 2. The switching element 2 should have sufficient capacity to carry the current load of heating resistor 3. The heating resistor 3 should possess adequate heat-producing capacity to raise the temperature of thermal circuit breaker 4 to specific point. The heating resistor 3 should be capable of transferring a quantity of heat to the thermal circuit breaker 4 greater than that produced by its normal current load.

Figure 2:
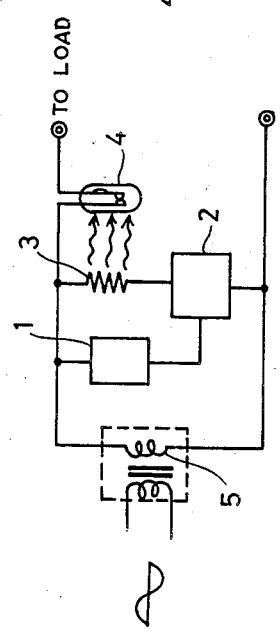
FIG. 2 is a detailed schematic diagram of the circuit of FIG. 1, using TRIAC as the controlling component.

In FIG. 2, the photoelectric element is a CDS resistor 1a, which reduces its internal resistance when illuminated, actuating a TRIAC; current flows in and warms up the heating resistor 3, and disconnects the contact points on the thermal current breaker 4 to cut off the current to the load. When the CDS resistor 1a is not illuminated, the TRIAC stops supplying current to the heating resistor 3, and the contact points on the thermal circuit breaker 4 are closed after the temperature is reduced to a specific point, again allowing the flow of electrical current to the load. In case of a short circuit on the transmission line to the load, the thermal circuit breaker turns off and on in a cyclic process to prevent the transformer from over heating.

Figure 3:
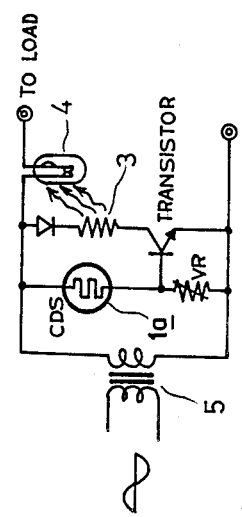
FIG. 3 is a schematic diagram of the circuit of FIG. 1, utilizing an SCR as controlling element.

In FIG. 3, an SCR is used, as a substitute for the TRIAC of FIG. 2.

Figure 4:
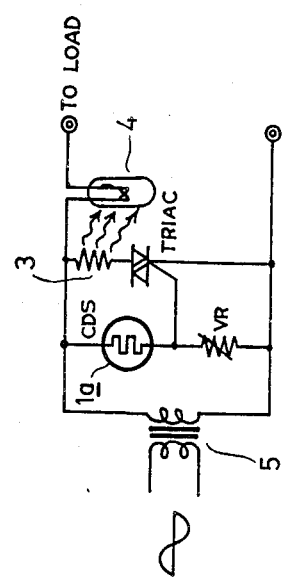
FIG. 4 is a schematic diagram of the circuit of FIG. 1, utilizing a power transistor as controlling element.

In FIG. 4, a crystal diode is connected in series with one end of the heating resistor 3, and a power transistor is used as the controlling element.

Figure 5:
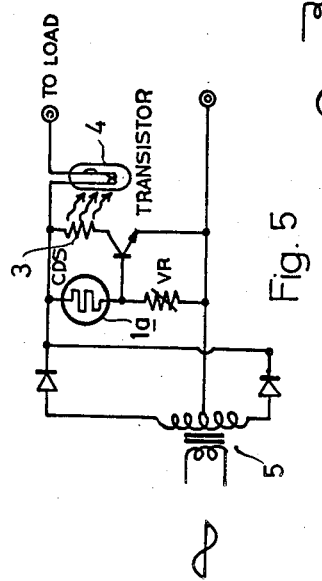
FIG. 5 is a schematic diagram of a variant of the circuit of FIG. 1, utilizing a direct current source of power and a power transistor as controlling element.

In FIG. 5, the power supply supplies direct current, and a power transistor is utilized as the controlling element.

Figure 6:
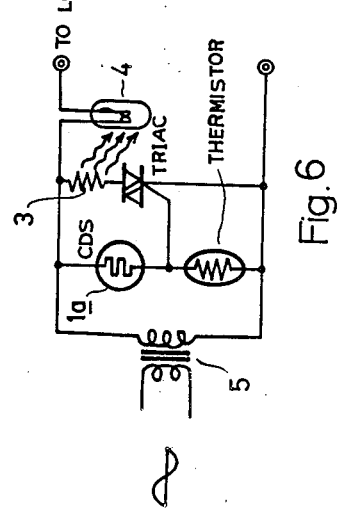
FIG. 6 is a schematic diagram of a variant of the circuit of FIG. 1, in which a heat sensitive resistor is thermally coupled to the heating element.

FIG. 6 illustrates a preferred embodiment of the circuit of FIG. 2 by thermal coupling a heat sensitive resistor, shown as a thermister, to the heating resistor 3. The heat sensitive resistor (thermister) is connected between the gate and one of the current-carrying electrodes of the TRIAC. When the heating resistor 3 warms up, the heat sensitive resistor (thermister) reduces its resistance value so as to delay the firing angle of the TRIAC which precludes the heating resistor 3 from overheating. This overheat protective arrangement is also illustrated in FIG. 2 to FIG. 5, in these cases the heat-sensitive resistance being illustrated as variable resistors VR.

Figure 7:
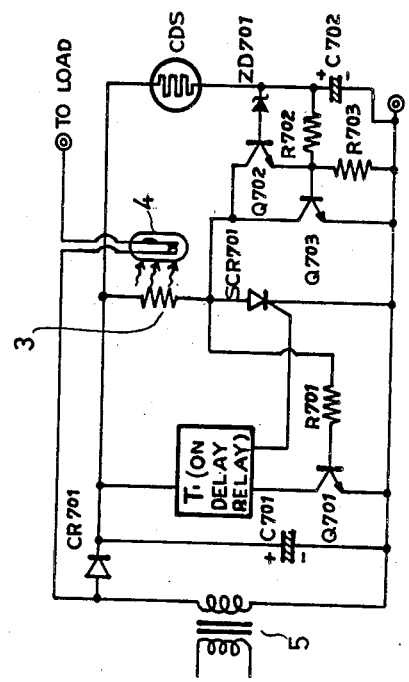
FIG. 7 is a schematic diagram of a preferred embodiment of the present invention, utilizing an SCR as the controlling element and having an on delay feature.

As illustrated in FIG. 7, a preferred embodiment of a light sensitive control and overload protective circuit for a low voltage illuminating system utilizes a photoconductive time switch by combining a thermal circuit breaker and a heating element. One transformer 5 constitutes a slow voltage power supply. A crystal diode CR701 is connected in series with a time switch T1 (on delay relay) and one end of the secondary winding of the transformer 5. A SCR 701 has its anode connected to and in series with the heating resistor 3, one end of the heating resistor connects with the positive terminal of power supply (the cathode of the diode CR701). The gate of the SCR701 connects with the delay signal output lead of time switch T1, and the cathode of the SCR701 is connected to the negative terminal of the power supply. A first transistor Q701 has its base connected in series with a resistor 701 which has its free end connected to the anode of the SCR701. The cathode of the SCR701 is connected to the emitter of a second transistor Q703, and the anode of the SCR701 is connected to the collector of a third transistor Q702. The on delay relay time switch T1 is operatively arranged to send out an electric signal at specified time after it is enabled, and it will automatically return to zero point when the power is off. The time switch T1 can be, for example, an analog or digital solid state timer, or an electro-mechanical timer. The transistors Q702 and Q703 are connected in a Darlington configuration, the base of the transistor Q702 links with a Zener Diode ZD701; a resistor R702 is connected in parallel with the emitter of transistor Q702 and the positive pole of Zener diode ZD701. A delay capacitor C702 is connected between the positive pole of the Zener diode ZD701 and a negative terminal of power supply to prevent interference. A resistor R703 connects between the cathode and base of the transistor Q703. One end of the light sensitive resistor CDS is connected to the positive terminal of power supply, with its other end being connecting to the base of the transistor Q702.

A bi-metal plate thermal circuit breaker 4 is located adjacent to a heating resistor 3 with its contact points in series connection between the load and a terminal of the secondary winding of the AC transformer 5. The operation of the circuit of FIG. 7 is set out hereinbelow.

When the light sensitive resistor CDS is illuminated, it actuates the transistors Q702 and Q703, heating up the heating resistor 3. Heat from the resistor 3 is transferred to and stored by the thermal circuit breaker 4. When the heat stored reaches a specific level, the contact points on the bi-metal plate circuit breaker are disconnected, thus cutting off load current to the electrical load. When the light sensitive resistor CDS is not illuminated, it actuates the transistor Q701 which enables the on delay relay time switch T1 and at the same time deactivates the transistors Q702 and Q703. The contact points on the bi-metal plate thermal circuit breaker 4 are closed again to resume supplying current to the electrical load after its delayed cooling off. The on delay relay time switch sends out an electrical signal at specified later time to actuate the SCR701, warming up the heating resistor 3 which activates the thermal circuit breaker 4 cutting off the current to transistor Q701. When the resistor CDS is illuminated again, it actuates the transistor Q703, the SCR701 again turning off the electric current to the load.

In case of the overload or short circuit on the transmission line to the load, the thermal circuit breaker 4 turns off and on in a cyclic process to protect power supply system.

The internal resistance of the Zener diode ZD701, the capacitor C702 and the light responsive resistor CDC constitute a delay circuit, which enables the capacitor C702 to slowly build up its voltage when the resistor CDC is illuminated with external light. The transistor Q702 is not actuated until the voltage across the capacitor C702 exceeds the Zener diode ZD701 breakdown voltage, so as to preclude interference from temporary sporadic light from the outside.

The delayed on and off effect skillfully designed into the circuit of FIG. 7 allows the thermal circuit breaker circuit arrangement to preclude interference from temporary sporadic light from the outside. The photothermic switch device is characterized by its protective features against electrical overload without the need of a relay, a very practical and creative feature.

I claim:

1. In a light-responsive control and overload protection circuit for low voltage illumination systems and which includes means responsive to ambient light for providing an enabling output, control means for switching heating current on when enabled, heat-producing means through which the heating current passes whenever the control means is enabled and heat-responsive circuit breaker means in circuit between a low voltage power source and load, the heat-producing means being thermally coupled to the heat-responsive circuit breaker means to transfer heat thereto and effect and maintain an opening thereof whenever sufficient ambient light is present, an improvement wherein said control means comprises means responsive to the enabling output for developing a start signal and an on time delay timer having an input receiving means responsive to the start signal for developing an on delay output control signal at a predetermined time after receipt of the enabling signal, said control means being responsive to the on delay output control signal thereby switching heating current on when enabled by the on delay relay signal, including a d.c. power supply and a capacitor, and wherein said means responsive to ambient light comprises a light-sensitive resistor connected in series with said capacitor across said d.c. power supply, including a first transistor and a Zener diode, said first transistor having its base coupled to a circuit point between said capacitor and said light-sensitive resistor via said Zener diode, and further including a second transistor and a pair of resistors, said pair of resistors being connected in series with one another and across said capacitor, said second transistor having its collector connected to the collector of the said first transistor and its base connected to the emitter of the said first transistor and to a circuit point between said pair of resistors.

2. The circuit according to claim 1, wherein said control means comprises an SCR.

3. The circuit according to claim 1, including a third transistor having its base coupled to said collectors of said second transistor and said first transistor, said collectors of said second transistor and said first transistor being connected to one terminal of said d.c. power supply via said heat-producing means.

* * * * *